(12) United States Patent
Bu

(10) Patent No.: US 11,342,519 B2
(45) Date of Patent: May 24, 2022

(54) DISPLAY PANEL INCLUDING FLEXIBLE SUBTRATE EXHIBITING IMPROVED BENDING PERFORMANCE, AND MANUFACTURING METHOD THEREOF

(71) Applicant: Wuhan China Star Optoelectronics Semiconductor Display Technology Co., Ltd., Hubei (CN)

(72) Inventor: Chenghao Bu, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 56 days.

(21) Appl. No.: 16/603,778

(22) PCT Filed: Apr. 26, 2019

(86) PCT No.: PCT/CN2019/084416
§ 371 (c)(1),
(2) Date: Jun. 25, 2020

(87) PCT Pub. No.: WO2020/124921
PCT Pub. Date: Jun. 25, 2020

(65) Prior Publication Data
US 2021/0336164 A1    Oct. 28, 2021

(30) Foreign Application Priority Data
Dec. 19, 2018  (CN) .......................... 201811557158.3

(51) Int. Cl.
*H01L 51/00*    (2006.01)
*H01L 27/32*    (2006.01)
(Continued)

(52) U.S. Cl.
CPC ...... *H01L 51/0097* (2013.01); *H01L 27/3246* (2013.01); *H01L 27/3262* (2013.01); *H01L 51/5253* (2013.01); *H01L 51/56* (2013.01)

(58) Field of Classification Search
CPC . H01L 51/0097; H01L 51/5253; H01L 51/56; H01L 27/3246; H01L 27/3262
(Continued)

(56) References Cited

U.S. PATENT DOCUMENTS

2018/0315809 A1\*  11/2018  Kim .................... H01L 27/3276
2019/0096975 A1\*  3/2019  Park .................... H01L 27/3262
(Continued)

FOREIGN PATENT DOCUMENTS

CN    105810716 A  *  7/2016
CN    105810716 A      7/2016
(Continued)

*Primary Examiner* — Matthew E. Gordon
(74) *Attorney, Agent, or Firm* — Taft Stettinius & Hollister LLP

(57) ABSTRACT

A display panel is provided with a deep hole area in a lower frame area of an array substrate, so that the lower frame area is bent back along the deep hole area, thereby achieving a narrow frame of the display panel. Simultaneously a stress relief hole is provided in the display area, which is used to release the stress generated when the display area is bent, so that the entire array substrate is less likely to be cracked or broken when bent, and the bending performance of the display panel is greatly improved.

5 Claims, 10 Drawing Sheets

(51) Int. Cl.
  *H01L 51/52*    (2006.01)
  *H01L 51/56*    (2006.01)
(58) Field of Classification Search
  USPC .......................................................... 257/40
  See application file for complete search history.

(56) References Cited

U.S. PATENT DOCUMENTS

| | | | |
|---|---|---|---|
| 2019/0181198 A1* | 6/2019 | Son | H01L 27/1288 |
| 2019/0280225 A1* | 9/2019 | Choi | H01L 51/5253 |
| 2020/0089368 A1* | 3/2020 | Shim | H01L 27/3276 |
| 2020/0168850 A1* | 5/2020 | Park | H01L 51/0097 |

FOREIGN PATENT DOCUMENTS

| | | | |
|---|---|---|---|
| CN | 107799538 A | * | 3/2018 |
| CN | 107799538 A | | 3/2018 |
| CN | 207780442 U | | 8/2018 |
| CN | 107799538 B | * | 6/2020 |

* cited by examiner

DISPLAY PANEL INCLUDING FLEXIBLE SUBTRATE EXHIBITING IMPROVED BENDING PERFORMANCE, AND MANUFACTURING METHOD THEREOF

CROSS-REFERENCE TO RELATED APPLICATIONS

This application is a U.S. National Phase of International PCT Application No. PCT/CN2019/084416 filed Apr. 26, 2019, which claims the benefit of Chinese Patent Application Serial No. 201811557158.3 filed Dec. 19, 2018, the contents of each application are incorporated herein by reference in their entirety.

FIELD OF INVENTION

The present invention relates to the field of display technologies, and in particular, to a display panel and a manufacturing method thereof.

BACKGROUND OF INVENTION

Compared with liquid crystal displays (LCDs), organic light emitting diodes (OLEDs) have the greatest advantage in that they can be manufactured on a flexible substrate. Since organic light emitting materials of OLED have bending resistance, the OLED display panels can be bent and folded. If a lower border portion of the OLED display panels is folded to the back of the display, the lower border of the OLED display panels can be further reduced to achieve a very narrow border or a borderless effect. If a display area of the OLED display panel is bent at a fixed bending radius, the surface of the OLED display panel can be curved.

Technical Problem

In view of this, how to curve the surface of the OLED display panel has become an important research topic for researchers.

Technical Solution

An object of the present invention is to provide a display panel and a manufacturing method thereof. The display panel is configured to provide a hole area in a lower frame area (i.e. a bending area) of an array substrate, so that the lower frame area is bent backward along the hole area, thereby achieving a narrow frame of the display panel. A stress release hole is disposed in the display area for releasing stress generated when the display area is bent, so that the entire array substrate is less likely to be cracked or broken when bent, and the bending performance of the display panel is greatly improved. In addition, the inorganic film layer in the hole of the bending area is etched, and the flexible substrate of the bending area is thinned by a special process for adjusting a neutral surface of the bending area during bending, so that the metal trace layer connecting the signal traces just falls on a neutral surface, and the metal trace layer is subjected to the minimum bending stress, thereby enhancing the bending radius and bending performance of the bending area. In addition, different methods are used to reduce the thickness of the flexible substrate according to different requirements, and the etching process can be controlled to save the display mask while performing flexible substrate thinning.

According to an aspect of the present invention, the present invention provides a display panel comprising a flexible substrate; a functional layer disposed on the flexible substrate, wherein the flexible substrate is divided into a non-bending area and a bending area, and the functional layer in the bending area has a hole area; and a first filling layer filled in a hole of the hole area; and a metal trace layer disposed on the first filling layer of the bending area and disposed on the neutral surface.

In an embodiment of the present invention, a bottom of the first filling layer is disposed within the flexible substrate.

In an embodiment of the present invention, further comprises a second filling layer and a barrier layer, wherein the non-bending area comprises a display area, the functional layer of the display area has at least one stress relief hole, the second filling layer is filled in the at least one stress relief hole, and a bottom of the second filling layer is disposed on the barrier layer in the functional layer.

In an embodiment of the present invention, the first filling layer and the second filling layer are made of organic materials.

According to another aspect of the present invention, the present invention provides a manufacturing method of the display panel as described above. The method comprises the following steps: (1) providing the flexible substrate, and forming a barrier layer on the flexible substrate; (2) performing exposure etching on the barrier layer to remove the barrier layer disposed in the bending area; (3) performing an oxygen plasma treatment on the etched flexible substrate to cause the flexible substrate of the bending area form a groove to thin the flexible substrate of the bending area; (4) filling the flexible substrate having the groove with organic materials in the bending area; (5) sequentially forming a buffer layer, an active layer, a gate insulating layer, a gate layer, and an interlayer insulating layer on the thinned flexible substrate; (6) exposing and developing the interlayer insulating layer to form the hole in the bending area and the stress relief hole in the display area, wherein the display area is disposed in the non-bending area; and (7) filling the hole and the stress relief hole with organic materials to form the first filling layer and a second filling layer, respectively.

In an embodiment of the present invention, in step (3), a depth of the groove is determined according to a flow rate of an oxygen plasma and a processing time.

In an embodiment of the present invention, in step (6), the interlayer insulating layer disposed in the bending area and the interlayer insulating layer disposed in the display area are simultaneously exposed and etched using the same etching process to form the hole disposed in the bending area and the stress relief hole disposed in the display area, respectively, and the hole and the stress relief hole have the same depth.

According to the other aspect of the present invention, the present invention provides a manufacturing method of the display panel as described above. The method comprises the following steps: (1) providing the flexible substrate, and sequentially forming a barrier layer, a buffer layer, an active layer, a gate insulating layer, a gate layer, and an interlayer insulating layer on the flexible substrate; (2) exposing and developing the bending area to expose the flexible substrate; (3) using the interlayer insulating layer as a blocking layer, etching the flexible substrate exposed by the bending area using an oxygen plasma treatment, and forming the hole; (4) performing an organic material coating treatment on the flexible substrate having the hole, and performing an exposure development to cause organic materials covering the hole and forming a first filling layer; (5) exposing the display area to develop the stress relief hole in the display area; and (6) performing an organic material coating treatment on the stress relief hole, and performing an exposure development to cause the organic materials be filled in the stress relief hole, such that the second filling layer is formed.

In an embodiment of the present invention, in step (3), an etched depth of the flexible substrate in the bending area is determined according to a flow rate of an oxygen plasma and a processing time.

Beneficial Effects

An advantage of the present invention is: the display panel is configured to provide a hole area in a lower frame area (i.e. a bending area) of an array substrate, so that the lower frame area is bent backward along the hole area, thereby achieving a narrow frame of the display panel. A stress release hole is disposed in the display area for releasing stress generated when the display area is bent, so that the entire array substrate is less likely to be cracked or broken when bent, and the bending performance of the display panel is greatly improved. In addition, the inorganic film layer in the hole of the bending area is etched, and the flexible substrate of the bending area is thinned by a special process for adjusting a neutral surface of the bending area during bending, so that the metal trace layer connecting the signal traces just falls on a neutral surface, and the metal trace layer is subjected to the minimum bending stress, thereby enhancing the bending radius and bending performance of the bending area. In addition, different methods are used to reduce the thickness of the flexible substrate according to different requirements, and the etching process can be controlled to save the display mask while performing flexible substrate thinning.

DESCRIPTION OF DRAWINGS

The following embodiments refer to the accompanying drawings for exemplifying specific implementable embodiments of the present disclosure in a suitable computing environment. It should be noted that the exemplary described embodiments are configured to describe and understand the present disclosure, but the present disclosure is not limited thereto.

DETAILED DESCRIPTION OF PREFERRED EMBODIMENTS

Figure 1:
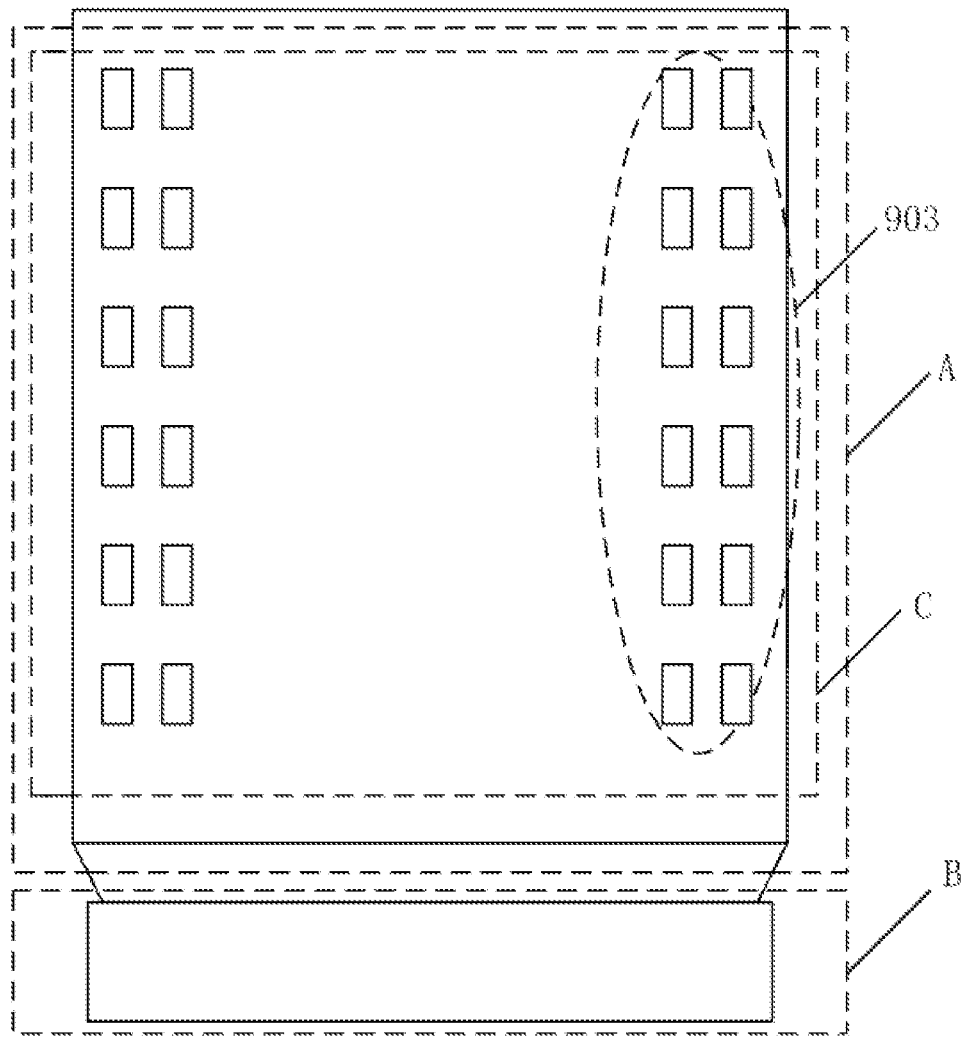
FIG. 1 is a schematic structural view of an array substrate of a display panel in an embodiment of the present invention.

The technical solutions in the embodiments of the present invention will be clearly and completely described in the following with reference to the accompanying drawings. It is apparent that the described embodiments are only a part of the embodiments of the invention, and not all of the embodiments. All other embodiments obtained by persons skilled in the art based on the embodiments of the present invention without creative efforts are within the scope of the present invention.

The terms "first," "second," "third," etc. (if present) in the specification and claims of the present invention and the above figures are used to distinguish similar objects and are not necessarily used to describe a particular order or prioritization. It should be understood that the objects so described are interchangeable where appropriate. Moreover, the terms "comprising" and "having" and "the" are intended.

The drawings, which are discussed below, and the various embodiments used to describe the principles of the present invention are intended to be illustrative only and not to limit the scope of the disclosure. Those skilled in the art will appreciate that the principles of the present invention may be implemented in any suitably arranged system. Exemplary embodiments will be described in detail, examples of which are illustrated in the accompanying drawings. Further, a terminal according to an exemplary embodiment will be described in detail with reference to the accompanying drawings. The same reference numerals in the drawings denote the same elements.

The terminology used in the description of the invention is for the purpose of description. Expressions used in the singular encompasses the plural forms of expression unless the context clearly dictates otherwise. In the description of the present invention, it is to be understood that the terms such as "comprises," "comprising," and "having" are intended to indicate the presence of the features, numbers, steps, acts, or combinations thereof disclosed in the specification. It is not intended to exclude the possibility that one or more other features, numbers, steps, acts or combinations may be added. The same reference numerals in the drawings denote the same parts.

Embodiments of the present invention provide a display panel and a manufacturing method thereof. The details will be described below.

Figure 2:
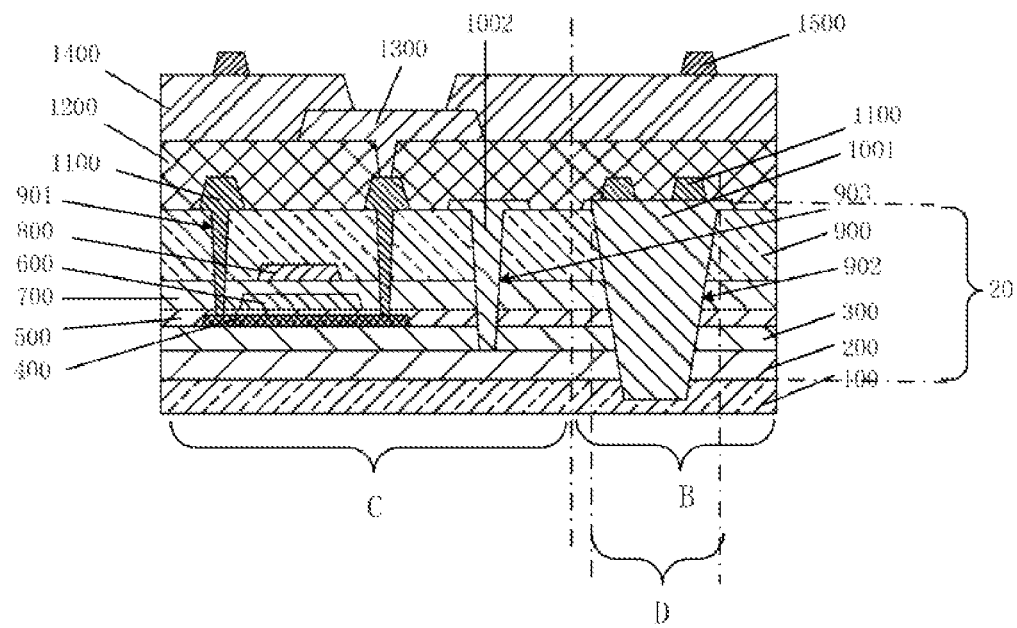
FIG. 2 is a schematic structural view of the display panel in the embodiment of the present invention.
Figure 3:
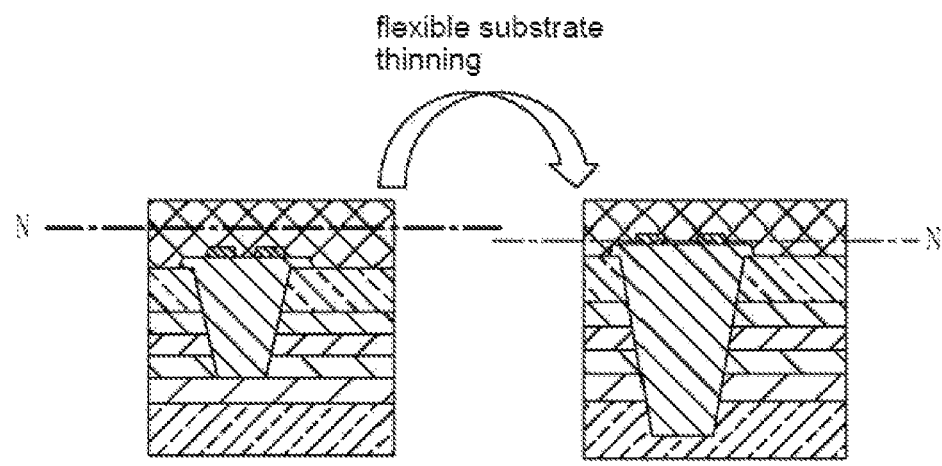
FIG. 3 is a schematic view showing the effect of the display panel in the embodiment of the present invention being affected by the thinning of the flexible substrate.

Please refer to FIG. 1 to FIG. 3. FIG. 1 is a schematic structural view of an array substrate of a display panel in an embodiment of the present invention. FIG. 2 is a schematic structural view of the display panel in the embodiment of the present invention. FIG. 3 is a schematic view showing the effect of the display panel in the embodiment of the present invention being affected by the thinning of the flexible substrate.

The present invention provides a display panel 10 including an array substrate (not shown), the array substrate further including a flexible substrate 100. The material of the flexible substrate 100 is made of a polymer material such as polyimide plastic, polyether ether ketone or transparent conductive polyester. In the present embodiment, a polyimide (PI) material is used, which has high temperature resistance, wide temperature range, no obvious melting point, high insulation property, and stable dielectric constant, and thus is widely used in the flexible substrate 100.

A functional layer 20 is disposed on the flexible substrate 100. The functional layer 20 includes, but is not limited to, a barrier layer 200, a buffer layer 300, an active layer 400, a gate insulating layer (specifically including a first gate insulating layer 500 and a second gate insulating layer 700), a gate layer (specifically including a first gate layer 600 and a second gate layer 800), an interlayer insulating layer 900, and a source and drain layer 1100, which are sequentially stacked. The barrier layer 200 and the buffer layer 300 serve as a buffer and a protective effect. The barrier layer 200 serves to prevent external moisture or oxygen from entering the display panel 10 and affecting the service life of the display panel 10. The buffer layer 300 is made of a silicon nitride and silicon oxide material. The active layer 400 is polysiliconized by the excimer laser crystallization technique. The gate insulating layer includes a first gate insulating layer 500 and a second gate insulating layer 700. The gate layer includes a first gate layer 600 (i.e. a first metal electrode and a gate trace layer, wherein the first metal electrode is a metal gate) and a second gate layer 800 (i.e. a second metal electrode and signal trace layer).

The flexible substrate 100 is divided into a non-bending area A and a bending area B. The non-bending area A refers to an area that does not need to be bent or folded. The bending zone B refers to an area that needs to be bent or folded, and generally does not include an active layer and a functional layer of various metal layers. The flexible substrate 100 and the functional layer 20 extend from the non-bending area A to the bending area B, that is, the flexible substrate 100 and the functional layer 20 are also divided into non-bending areas A and bending areas B. The flexible substrate 100 includes a flexible substrate 100 that is disposed in the non-bending area A and a flexible substrate 100 that is disposed in the bending area B. As shown in FIG. 2, the non-bending area A further includes a display area C, and the bending area is disposed on one side of the display area C.

Further, the functional layer in the display area C has at least one stress relief hole 903. A second filling layer 1002 is filled in the stress relief hole 903, and a bottom of the second filling layer 1002 is disposed on the barrier layer 200 in the functional layer. The second filling layer 1002 is made of organic materials. Specifically, the stress relief hole 903 is disposed in a subpixel gap area of the array substrate. A portion of the inorganic film layer in the stress relief hole 903 is etched by an etching process, and then the stress relief hole 903 is filled with organic materials. Therefore, the stress can be released when the display panel 10 is bent, and the display panel 10 can be made more resistant to bend and achieve the effect of the curved screen.

The functional layer in the bending area B has a hole area D, and a first filling layer 1001 is filled in the hole 902 of the hole area D. The bottom of the first filling layer 1001 is disposed in the flexible substrate 100. The first filling layer 1001 is made of organic materials. Further, the flexible substrate 100 of the bending area B forms a groove 904 in which a portion of the first filling layer 1001 is disposed. In the present embodiment, the flexible substrate 100 can be thinned by using an oxygen plasma method.

As shown in FIG. 3, the metal trace layer 1100 is disposed on the first filling layer 1001 of the bending area B, and the metal trace layer 1100 is disposed on a neutral surface N. The specific description of the neutral surface N is as follows: when the display panel is bent, the neutral surface N exists on the display panel. The neutral surface N is a critical surface that is not subjected to tensile stress during the bending process, and is not subjected to compressive stress. The film layer on the side of the neutral surface N close to the convex side (i.e. the outer side of the bending area) will be subjected to tensile stress, on the side of the neutral surface N away from the convex side (i.e. the inner side of the bending area) will be subjected to compressive stress, and the closer the film layer is to the neutral surface N, the less stress is applied.

The metal trace layer 1100 includes a plurality of metal traces (not shown). The signal traces on both sides of the bending area are bridged by the bend-resistant metal traces, and the metal traces are patterned to enhance the bending performance. Therefore, the thickness of the flexible substrate 100 of the bending area B can be thinned to adjust the position of the integrally bent neutral surface N. As a result, the metal trace layer 1100 falls on the neutral surface N, the stress is minimized when the metal trace is bent, which can increase the bending radius and bending effect of the bending area B.

In addition, the interlayer insulating layer 900 of the display area C includes a contact hole 901 for connecting the metal trace layer 1100 and the active layer 400 disposed on the interlayer insulating layer 900.

In addition, the display panel 10 further includes a light emitting layer disposed on the functional layer 20 of the array substrate. The light emitting layer may include a pixel defining layer and a spacer layer. Specifically, in the display area C and the bending area B, a flat layer 1200 is disposed on the metal trace layer 1100, and the flat layer 1200 is patterned to realize the connection between the metal trace layer 1100 and a contact hole 901 of the pixel electrode layer. A pixel electrode layer 1300 is formed on the patterned flat layer 1200 and patterned. A pixel defining layer 1400 and a spacer layer 1500 are deposited on the patterned pixel electrode layer 1300, and a light emitting layer is disposed in an open area of the pixel defining layer 1400.

Therefore, as shown in FIG. 1, the present invention provides a bending area B by the lower frame area of the array substrate (not shown) of the display panel 10. In the bending area B, only the flexible substrate 100, the first filling layer 1001 (made of organic materials), and the metal trace layer 1100 for signal line bonding are present, and the inorganic film layer is etched away. The flexible substrate 100 of the bending area B is thinned by a special process (as described below) to adjust the neutral surface N when the bending area B is bent. The metal trace layer 1100 thus falls in the neutral face N, the bending stress is minimized, so that the bending radius can be reduced. After the array substrate is subjected to an organic light emitting diode (OLED) material evaporation coating and the bonding of the flexible printed circuit board/drive chip is completed, the entire area of the lower frame area may be bent along the hole 902 of the bending area B, thereby increasing the display area of the entire surface of the display panel 10 and achieving a narrow border or even no border effect. The curved surface of the display panel 10 is further realized by a stress relief hole 903 designed in a subpixel gap area (not shown) of the array substrate, and the inorganic film layer in the stress relief hole 903 is etched partially. The stress relief hole 903 is filled with organic materials to release the stress when the array substrate is bent, so that the entire array substrate is less likely to be cracked or broken when bent, and the bending performance of the display panel 10 is greatly improved.

Figure 4:
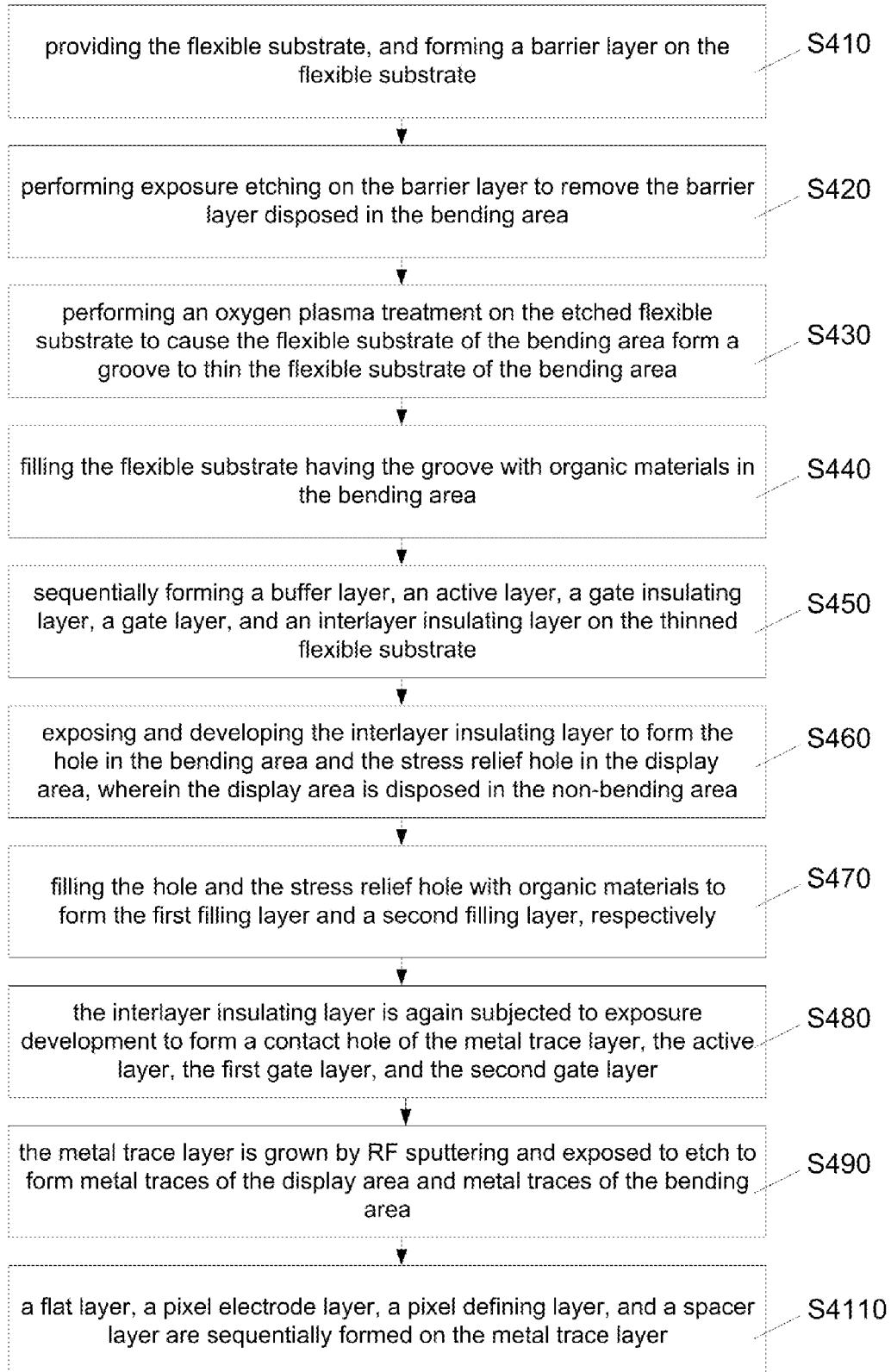
FIG. 4 is a flow chart showing the steps of a manufacturing method of the display panel in accordance with an embodiment of the present invention.

Refer to FIG. 4, FIG. 5A to FIG. 5I. FIG. 4 is s a flow chart showing the steps of a manufacturing method of the display panel in accordance with an embodiment of the present invention. FIG. 5A to FIG. 5I are process flow diagrams showing a manner of manufacturing the display panel in the embodiment of the present invention.

Figure 5A:
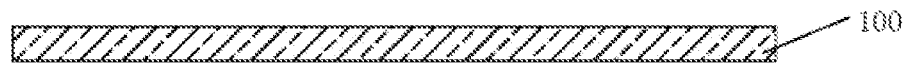
FIG. 5A to FIG. 5I are process flow diagrams showing a manner of manufacturing the display panel in the embodiment of the present invention.
Figure 5B:
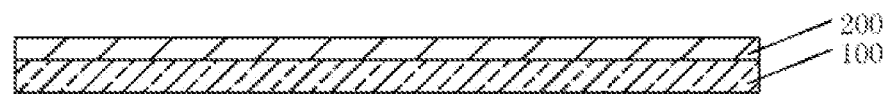

The present invention provides a manufacturing method of the display panel 10 as described above, the method comprises the following steps:

Refer to FIG. 5A to FIG. 5B, in step S410: providing the flexible substrate, and forming a barrier layer on the flexible substrate.

A barrier layer 200 of 5000 angstroms was grown by chemical vapor deposition on a flexible substrate, and the barrier layer 200 was made of a silicon oxide material.

Figure 5C:
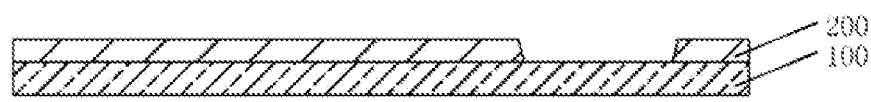

Refer to FIG. 5C, in step S420: performing exposure etching on the barrier layer to remove the barrier layer disposed in the bending area.

The barrier layer 200 is subjected to exposure etching to etch away the barrier layer 200 disposed in the bending area, and the barrier layer 200 of other areas (such as the display area) remains.

Figure 5D:
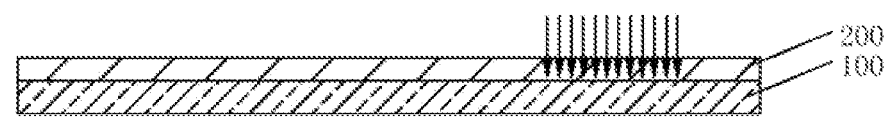

Refer to FIG. 5D, in step S430: performing an oxygen plasma treatment on the etched flexible substrate to cause the flexible substrate of the bending area form a groove 904 to thin the flexible substrate of the bending area.

The etched flexible substrate is directly subjected to an oxygen plasma treatment. In the bending area, the flexible substrate is directly etched by oxygen and forms the groove 904 due to the absence of blocking by the barrier layer 200. The flexible substrate of the other areas is not etched by oxygen due to the barrier of the barrier layer 200, so that the thinning of the flexible substrate of the bending area can be achieved, and the depth of the groove 904 is determined based on the flow rate of the oxygen plasma and the processing time.

Figure 5E:

Refer to FIG. 5E, in step S440: filling the flexible substrate having the groove with organic materials in the bending area.

Coating the organic materials on the thinned flexible substrate, and performing exposure development, so that the organic materials in the bending area fills the thickness difference due to the thinned flexible substrate, and the thickness difference is determined according to an opening depth of the groove 904. Organic materials in other areas, such as display areas, are removed. The purpose of this step is to planarize the thinned flexible substrate.

Figure 5F:
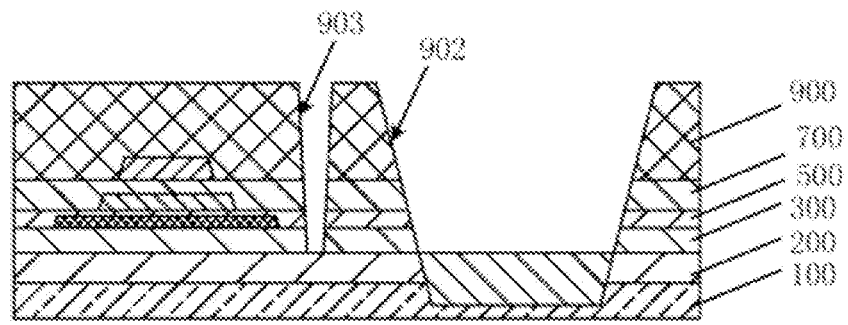

Refer to FIG. 5F, in step S450: sequentially forming a buffer layer, an active layer, a gate insulating layer, a gate layer, and an interlayer insulating layer on the thinned flexible substrate.

A 3500 angstrom buffer layer 300 and a 500 angstrom amorphous silicon layer are sequentially formed on the thinned flexible substrate, and the buffer layer 300 is made of silicon nitride and silicon oxide materials. The active layer 400 is formed by crystallization, exposure, and etching by an excimer laser annealing method. A 1000 angstrom first gate insulating layer 500 is grown by chemical vapor deposition, and the first gate insulating layer 500 is made of a silicon oxide material. Then, a 2500 angstrom first metal layer was grown by RF sputtering and exposed to form a first metal gate and gate trace layer. Then, a 1100 angstrom second gate insulating layer 700 is grown by chemical vapor deposition, and the second gate insulating layer 700 is made of a silicon nitride material. The second metal layer is grown by RF sputtering and exposed to form a second metal electrode and a signal trace layer. Next, an interlayer insulating layer 900 of 5000 angstroms was grown by chemical vapor deposition.

Refer to FIG. 5F, in step S460: exposing and developing the interlayer insulating layer 900 to form the hole in the bending area and the stress relief hole 903 in the display area, wherein the display area is disposed in the non-bending area.

In step S460, the interlayer insulating layer 900 disposed in the bending area and the interlayer insulating layer 900 disposed in the display area are simultaneously exposed and etched by using the same etching process to form the hole 902 in the bending area and the stress relief hole 903 in the display area respectively. The holes 902 and the stress relief holes 903 have the same depth, that is, the target etching depths of the two are the same.

Figure 5G:
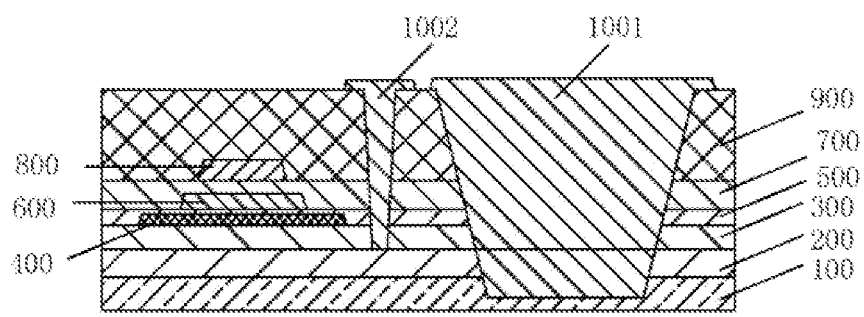

Refer to FIG. 5G in step S470: filling the hole and the stress relief hole with organic materials to form the first filling layer and a second filling layer, respectively.

After being performed based on step S460, the hole 902 and the stress relief hole 903 are filled with organic materials, and exposure development is performed such that the hole 902 and the stress relief hole 903 are filled with the organic materials. Other areas are filled with no organic materials. The depth of the hole 902 and the stress relief hole 903 are substantially the same, and therefore, the filling effect can be achieved by only applying the same organic material coating exposure development process.

Figure 5H:
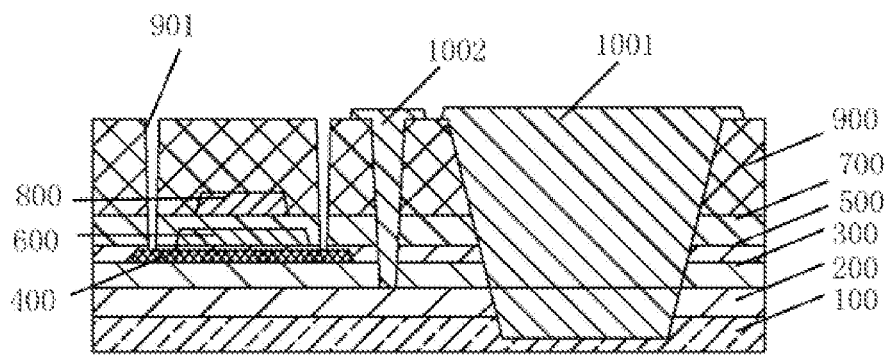

After step S470, the method further includes:

Refer to FIG. 5H, in step S480: the interlayer insulating layer 900 is again subjected to exposure development to form a contact hole 901 of the metal trace layer 1100, the active layer, the first gate layer 600, and the second gate layer 800.

Figure 5I:
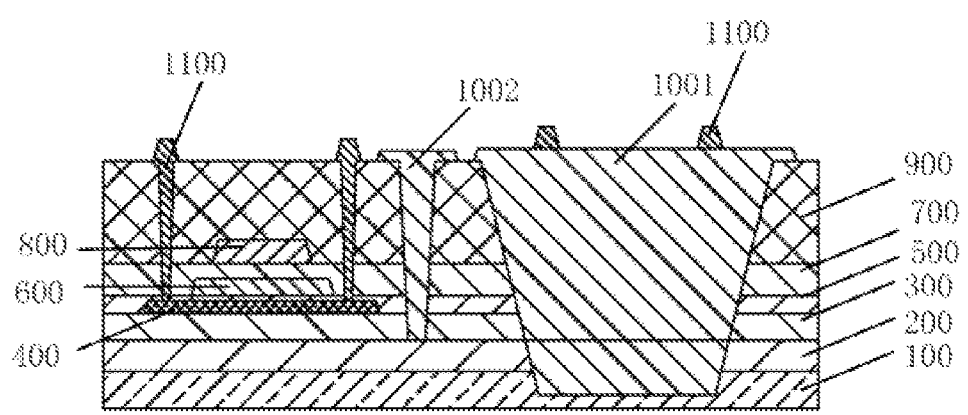

Refer to FIG. 5I, in step S490: the metal trace layer is grown by RF sputtering and exposed to etch to form metal traces of the display area and metal traces of the bending area.

Referring to FIG. 2, step S4100: a flat layer, a pixel electrode layer, a pixel defining layer 1400, and a spacer layer 1500 are sequentially formed on the metal trace layer.

Through the implementation of the above steps, the thinning treatment of the flexible substrate of the entire bending area and the preparation of the bending resistant array substrate of the display area are completed. Among them, the array substrate process requires 13 reticle tracks.

Figure 6:
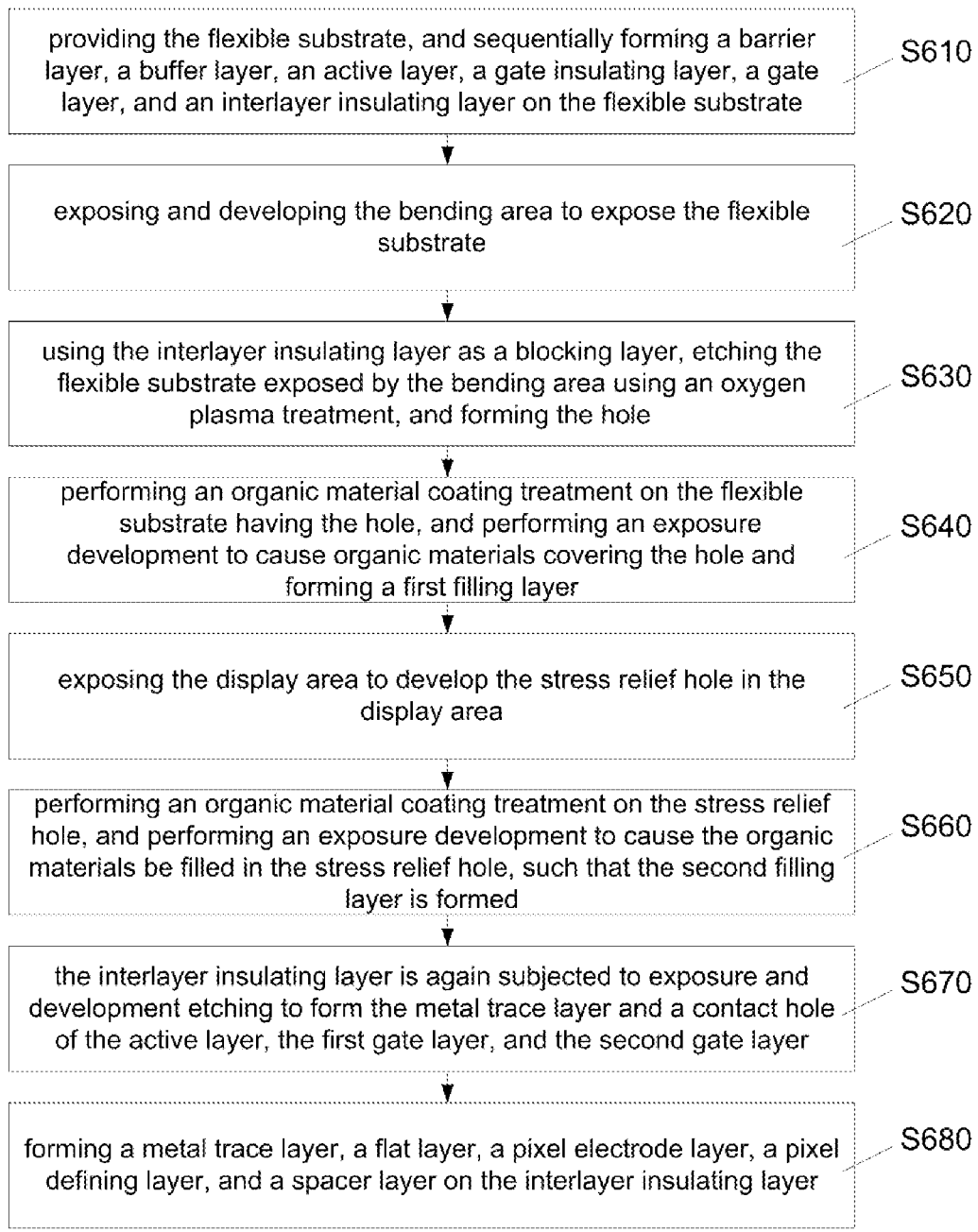
FIG. 6 is a flow chart showing the steps of a manufacturing method of the display panel in another embodiment of the present invention.

FIG. 6 is a flow chart showing the steps of a manufacturing method of the display panel in another embodiment of the present invention. FIG. 7A to FIG. 7H are process flow diagrams showing a manner of manufacturing a display panel according to another embodiment of the present invention.

Figure 7A:
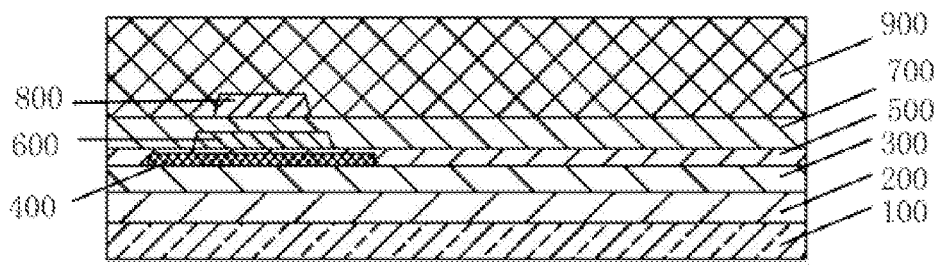
FIG. 7A to FIG. 7H are process flow diagrams showing a manner of manufacturing a display panel according to another embodiment of the present invention.

The present invention provides a manufacturing method of a display panel 10, the method comprising the following steps:

Refer to FIG. 7A, in step S610: providing the flexible substrate, and sequentially forming a barrier layer, a buffer layer, an active layer, a gate insulating layer, a gate layer, and an interlayer insulating layer on the flexible substrate.

A 5000 angstrom barrier layer 200, a 3500 angstrom buffer layer 300, and a 500 angstrom amorphous silicon layer are sequentially grown by chemical vapor deposition on a flexible substrate, wherein the barrier layer 200 is made of a silicon oxide material, and the buffer layer 300 is made of a silicon nitride and silicon oxide material. Next, the active layer 400 is formed by crystallization, exposure, and etching by an excimer laser annealing method. Then, a 1000 angstrom first gate insulating layer 500 is grown by chemical vapor deposition, and the first gate insulating layer 500 is made of a silicon oxide material. Then, a 2500 angstrom first metal layer was grown by RF sputtering and exposed to form a first metal gate and gate trace layer. Then, a 1100 angstrom second gate insulating layer 700 is grown by chemical vapor deposition, and the second gate insulating layer 700 is made of a silicon nitride material. The second metal layer is grown by RF sputtering and exposed to form a second metal electrode and a signal trace layer. Next, an interlayer insulating layer 900 of 5000 angstroms was grown by chemical vapor deposition.

Figure 7B:
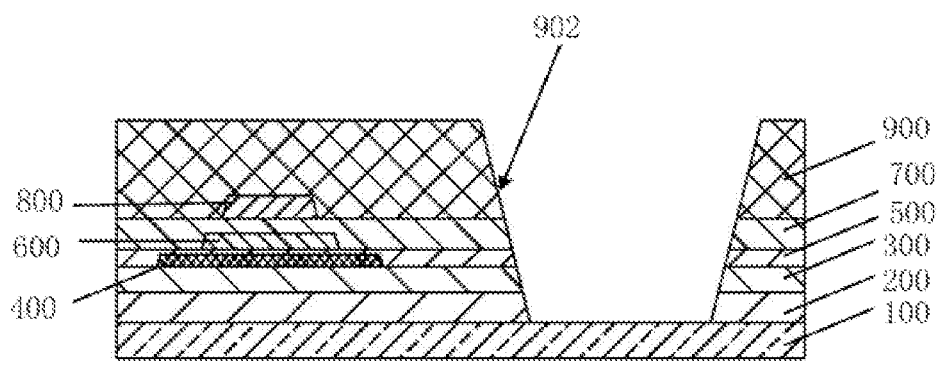

Refer to FIG. 7B, in step S620: exposing and developing the bending area to expose the flexible substrate.

The bending area was exposed and developed, and the inorganic film layer of the bending area was etched away by dry etching to expose the flexible substrate to an etching depth of 15,900 angstroms.

Figure 7C:
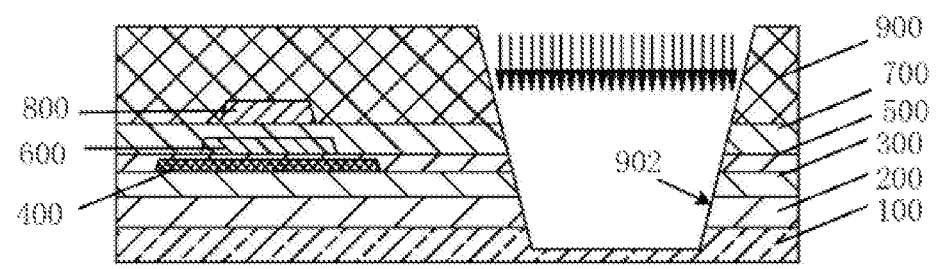

Refer to FIG. 7C, in step S630: using the interlayer insulating layer as a blocking layer, etching the flexible substrate exposed by the bending area using an oxygen plasma treatment, and forming the hole 902.

In step S630, the depth at which the flexible substrate of the bending area is etched is determined according to the flow rate of the oxygen plasma and the processing time. In addition to the bending area, the flexible substrate of other areas (such as the display area) is protected by the interlayer insulating layer 900 so as not to be etched, thus forming the effect of thinning the flexible substrate of the bending area.

Figure 7D:
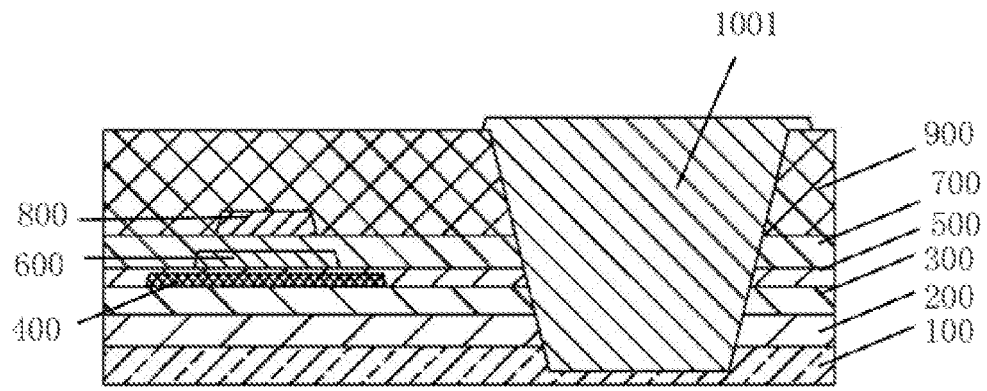

Refer to FIG. 7D, in step S640: performing an organic material coating treatment on the flexible substrate having the hole 902, and performing an exposure development to cause organic materials covering the hole and forming a first filling layer 1001.

The above substrate is subjected to organic material (for example, an organic photoresist, hereinafter the same) coating treatment so that the hole 902 of the bending area is covered by the organic photoresist, and the other areas have no photoresist.

Figure 7E:
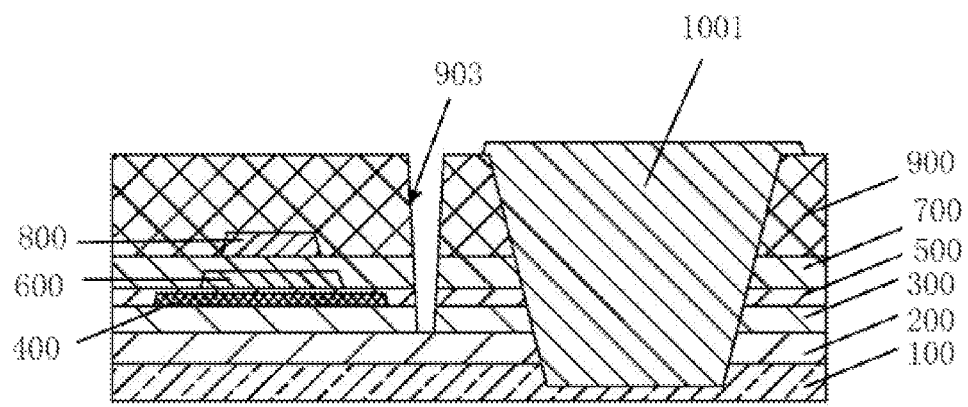

Refer to FIG. 7E, in step S650: exposing the display area to develop the stress relief hole in the display area.

The display area of the substrate is exposed, the stress relief hole 903 of the display area is developed, and a portion of the inorganic film layer in the stress relief hole 903 of the display area is etched by dry etching to an etching depth of about 1 μm.

Figure 7F:
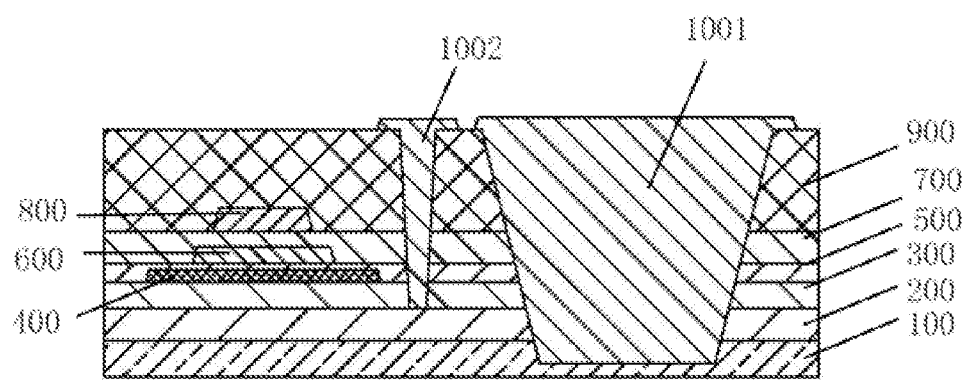

Refer to FIG. 7F, in step S660: performing an organic material coating treatment on the stress relief hole, and performing an exposure development to cause the organic materials be filled in the stress relief hole, such that the second filling layer is formed.

The substrate is subjected to an organic photoresist coating treatment, and exposure development is performed such that the stress relief holes 903 of the display area are filled with an organic photoresist while the other areas have no organic photoresist. Since the depth of the stress relief hole 903 of the display area is largely different from the depth of the hole 902 of the bending area, step S660 is not suitable for combination with step S640.

Figure 7G:
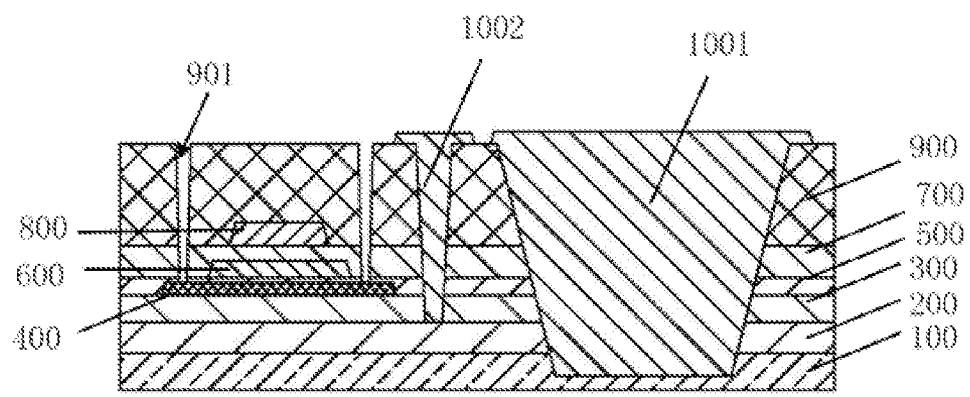

After step S660, the method further includes:

Refer to FIG. 7G, in step S670: the interlayer insulating layer is again subjected to exposure and development etching to form the metal trace layer 1100 and a contact hole 901 of the active layer, the first gate layer 600, and the second gate layer 800.

Figure 7H:
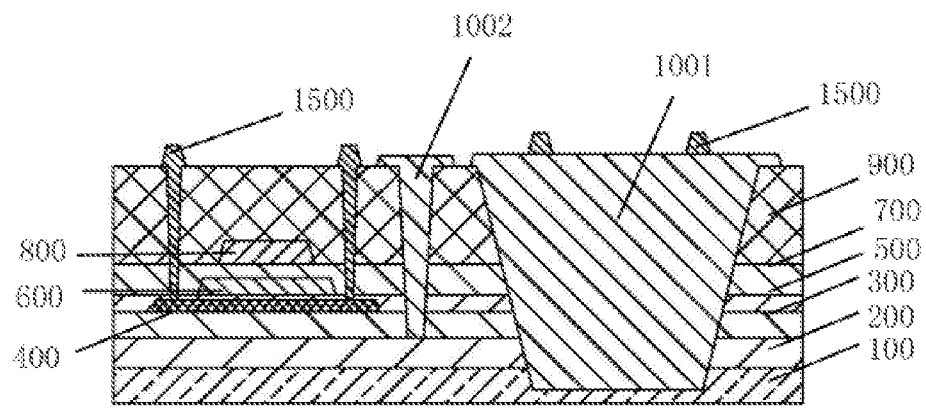

Refer to FIG. 7H, in step S680: forming a metal trace layer, a flat layer, a pixel electrode layer, a pixel defining layer 1400, and a spacer layer 1500 on the interlayer insulating layer, thereby completing a thinning process of the flexible substrate in the entire bending area, and the preparation of a bend resistant array substrate of a display area. Among them, the array substrate process requires 13 reticle tracks.

An advantage of the present invention is: the display panel is configured to provide a hole area D in a lower frame area (i.e. a bending area) of the array substrate, so that the lower frame area is bent back along the hole area D, thereby achieving a narrow frame of the display panel. At the same time, a stress release hole 903 is disposed in the display area for releasing stress generated when the display area is bent, so that the entire array substrate is less likely to be cracked or broken when bent, and the bending performance of the display panel is greatly improved. The inorganic film layer in the hole 902 of the bending area is etched, and the flexible substrate of the bending area is thinned by a special process for adjusting the neutral surface N of the bending area during bending, so that the neutral surface N just falls on the metal trace layer 1100 for bridging the signal traces, and the metal trace layer 1100 is subjected to the minimum bending stress, thereby enhancing the bending radius and bending performance of the bending area. In addition, different methods are used to reduce the thickness of the flexible substrate according to different requirements, and the etching process can be controlled to save the display mask while performing flexible substrate thinning.

In the above, various other corresponding changes and modifications can be made according to the technical solutions and technical ideas of the present invention to those skilled in the art, and all such changes and modifications are within the scope of the claims of the present invention.

INDUSTRIAL APPLICABILITY

The subject matter of the present application can be manufactured and used in the industry with industrial applicability.

What is claimed is:

1. A manufacturing method of a display panel, comprising the following steps:
   (1) providing a flexible substrate and forming a barrier layer on the flexible substrate, wherein the flexible substrate comprises a non-bending area and a bending area, and the non-bending area comprises a display area;
   (2) performing exposure etching on the barrier layer to remove the barrier layer disposed in the bending area;
   (3) performing an oxygen plasma treatment on the flexible substrate to cause the flexible substrate of the bending area form a groove to thin the flexible substrate of the bending area;
   (4) filling the flexible substrate having the groove with organic materials in the bending area;
   (5) sequentially forming a buffer layer, an active layer, a gate insulating layer, a gate layer, and an interlayer insulating layer on the flexible substrate;
   (6) exposing and developing the interlayer insulating layer to form a hole in the bending area and a stress relief hole in the display area;
   (7) filling the deep hole and the stress relief hole with organic materials to form a first filling layer and a second filling layer, respectively; and
   (8) forming a metal trace layer on the first filling layer of the bending area and positioning the metal trace layer on a neutral surface.

2. The manufacturing method as claimed in claim 1, wherein in step (3), a depth of the groove is determined according to a flow rate of an oxygen plasma and a processing time.

3. The manufacturing method as claimed in claim 1, wherein in step (6), the interlayer insulating layer disposed in the bending area and the interlayer insulating layer disposed in the display area are simultaneously exposed and etched using the same etching process to form the hole disposed in the bending area and the stress relief hole disposed in the display area, respectively, and the hole and the stress relief hole have the same depth.

4. A manufacturing method of a display panel, comprising the following steps:
- (1) providing a flexible substrate, and sequentially forming a barrier layer, a buffer layer, an active layer, a gate insulating layer, a gate layer, and an interlayer insulating layer on the flexible substrate, wherein the flexible substrate comprises a non-bending area and a bending area, and the non-bending area comprises a display area;
- (2) exposing and developing the bending area to expose the flexible substrate;
- (3) using the interlayer insulating layer as a blocking layer, etching the flexible substrate exposed by the bending area using an oxygen plasma treatment and forming a hole;
- (4) performing an organic material coating treatment on the flexible substrate having the hole, and performing an exposure development to cause organic materials covering the hole and forming a first filling layer;
- (5) exposing the display area to develop a stress relief hole in the display area;
- (6) performing an organic material coating treatment on the stress relief hole and performing an exposure development to cause the organic materials be filled in the stress relief hole to form a second filling layer; and
- (7) forming a metal trace layer on the first filling layer of the bending area and positioning the metal trace layer on a neutral surface.

5. The manufacturing method as claimed in claim 4, wherein in step (3), an etched depth of the flexible substrate in the bending area is determined according to a flow rate of an oxygen plasma and a processing time.

* * * * *